(12) United States Patent
Pachamuthu et al.

(10) Patent No.: US 8,530,297 B2
(45) Date of Patent: Sep. 10, 2013

(54) PROCESS FOR FABRICATING NON-VOLATILE STORAGE

(75) Inventors: Jayavel Pachamuthu, Yokkaichi (JP);
Vinod R. Purayath, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 472 days.

(21) Appl. No.: 12/762,341

(22) Filed: Apr. 18, 2010

(65) Prior Publication Data
US 2011/0256707 A1    Oct. 20, 2011

(51) Int. Cl.
*H01L 21/8238* (2006.01)
*G11C 16/04* (2006.01)

(52) U.S. Cl.
USPC ........... 438/201; 438/211; 438/257; 438/593; 438/E29.129; 438/E29.179; 438/E29.422; 365/185.05; 365/185.17

(58) Field of Classification Search
None
See application file for complete search history.

(56) References Cited

U.S. PATENT DOCUMENTS

| | | | |
|---|---|---|---|
| 6,514,868 B1 | 2/2003 | Hui | |
| 7,081,413 B2 | 7/2006 | Chan | |
| 7,154,779 B2 * | 12/2006 | Mokhlesi et al. | 365/185.01 |
| 7,253,470 B1 | 8/2007 | Liu | |
| 7,405,968 B2 * | 7/2008 | Mokhlesi et al. | 365/185.01 |
| 7,553,721 B2 | 6/2009 | Moon | |
| 8,111,552 B2 * | 2/2012 | Lutze et al. | 365/185.05 |
| 2006/0245245 A1 * | 11/2006 | Mokhlesi et al. | 365/185.01 |
| 2007/0025145 A1 * | 2/2007 | Mokhlesi et al. | 365/185.01 |
| 2008/0171406 A1 | 7/2008 | Kai | |
| 2008/0293201 A1 | 11/2008 | Goda | |
| 2009/0068812 A1 | 3/2009 | Prall | |

* cited by examiner

*Primary Examiner* — Alonzo Chambliss
(74) *Attorney, Agent, or Firm* — Vierra Magen Marcus LLP

(57) ABSTRACT

Fabricating non-volatile storage includes creating gate stacks with hard masks on top of the gate stacks. The gate stacks include two polysilicon layers and a dielectric layer between the two polysilicon layers. A portion of the hard mask over each gate stack is removed, leaving two separate tapered sections of each of the hard masks positioned above an upper polysilicon layer of the gate stacks. After the removing the portion of the hard masks, fluorine is implanted into the upper polysilicon layer of the gate stacks. Metal is added on the top surface of the upper polysilicon layer of the floating gate stacks. A silicidation process for the metal and the upper polysilicon layer of the gate stacks is preformed and the remaining tapered sections of the hard mask are removed. Other control lines can then be added.

16 Claims, 11 Drawing Sheets

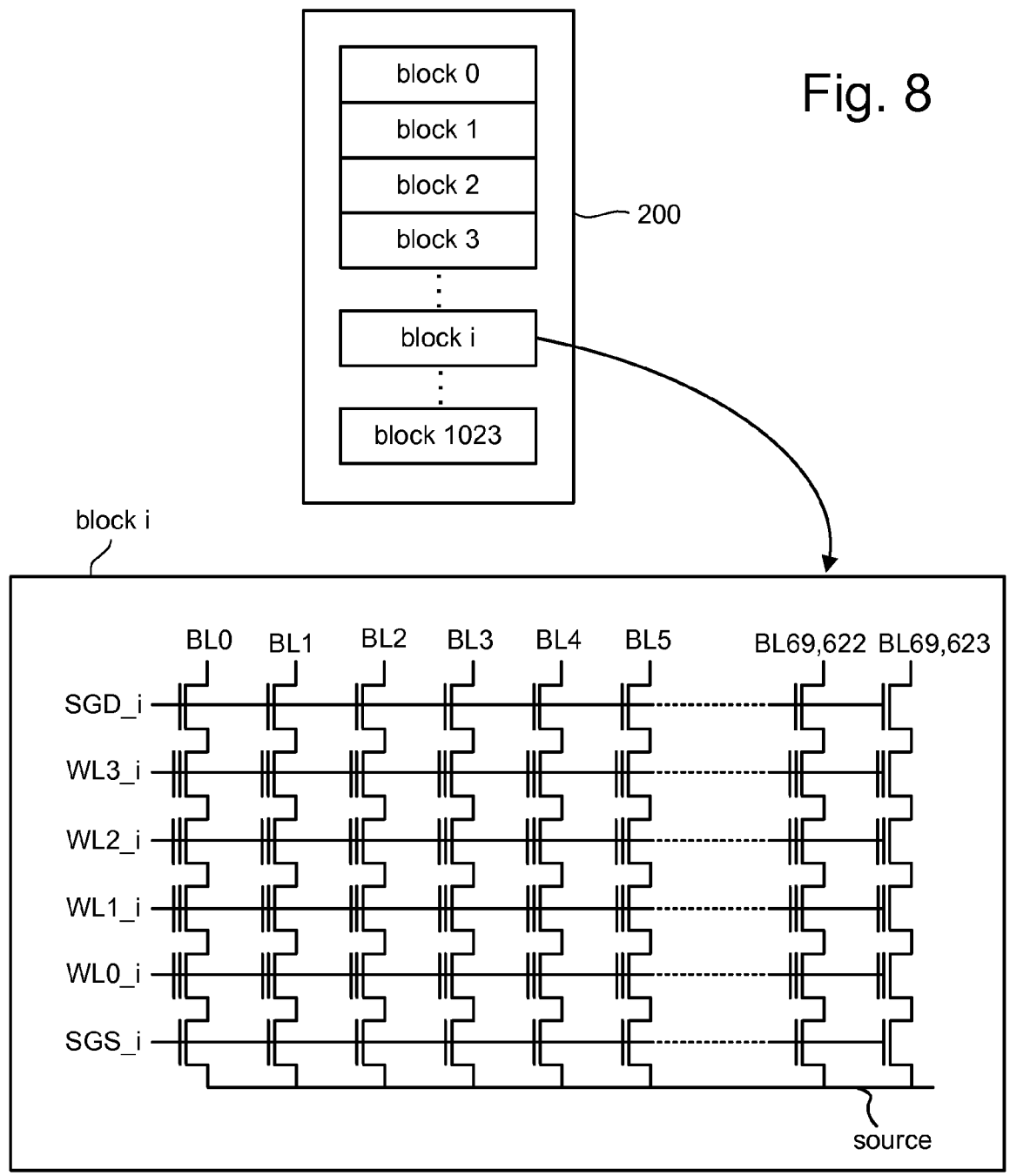

PROCESS FOR FABRICATING NON-VOLATILE STORAGE

BACKGROUND

1. Field

The technology described herein is directed to fabricating non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

Each memory cell can store data (analog or digital). When storing one bit of digital data (referred to as a binary memory cell), possible threshold voltages of the memory cell are divided into two ranges which are assigned logical data "1" and "0." In one example of a NAND type flash memory, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as a multi-state memory cell). In the case of storing multiple levels of data, the range of possible threshold voltages is divided into the number of levels of data. For example, if four levels of information is stored, there will be four threshold voltage ranges assigned to the data values "11", "10", "01", and "00." In one example of a NAND type memory, the threshold voltage after an erase operation is negative and defined as "11." Positive threshold voltages are used for the states of "10", "01", and "00." If eight levels of information (or states) are stored in each memory cell (e.g. for three bits of data), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wear on the memory cells. Different encoding schemes can be used.

To read multi-state memory cells, the memory system steps through various predefined control gate voltages corresponding to the various memory states supported by the memory. A sense amplifier may trip (e.g., indicating flow of current) at one of these voltages and the system will determine the resultant memory state by consideration of the tripping event(s) of the sense amplifier.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of pulses in which the magnitude of the pulses is increased by a predetermined step size for each successive pulse.

Many non-volatile storage systems include an array of memory cells arranged in columns and rows. Control lines (e.g., word lines, bit lines, or other types of control lines) connect to the various rows and columns.

To increase the capacity of a memory devices, designers of memory have aggressively scaled down the size of the devices. However, such reduction in size can cause problems. In particular, the formation of gate contacts on extremely narrow patterned features is an issue for manufacturing non-volatile storage. Examples of concerns include word line to word line bridging effects (e.g., shorts caused by metal whiskers), poor surface morphology including roughness, agglomeration on the top surface of the control gate, non-uniform diffusion during the silicidation process (which may cause a control gate-floating gate leak), thermal stability of silicide phase, high word line sheet resistance, leakage current, and low word line electric field break down.

BRIEF DESCRIPTION OF THE DRAWINGS

FIG. 8 is a block diagram depicting one embodiment of a memory array.

DETAILED DESCRIPTION

An improved process is proposed for fabricating non-volatile storage. One embodiment of the proposed process includes creating gate stacks with hard masks on top of the gate stacks. The gate stacks include a lower polysilicon layer (commonly referred to as Floating Gate), an inter-dielectric material and an upper polysilicon layer (commonly referred to as Control Gate). A portion of the hard masks is removed, leaving two separate tapered sections of each of the hard masks positioned above the upper polysilicon layer of the gate stacks. After the removing the portion of the hard masks, fluorine is implanted into the upper polysilicon layer of the gate stacks. Metal is added on the top surface of the upper polysilicon layer of the gate stacks. A silicidation process for the metal and the upper polysilicon layer of the gate stacks is preformed and the remaining tapered sections of the hard mask are removed. Other control lines can then be added. Some embodiments will not include the implantation of fluorine. Some embodiments will not include the creation and use of the tapered sections of the hard mask and, therefore, will either not use a hard mask, remove the entire hard mask or do something other than forming the tapered sections.

Figure 1:
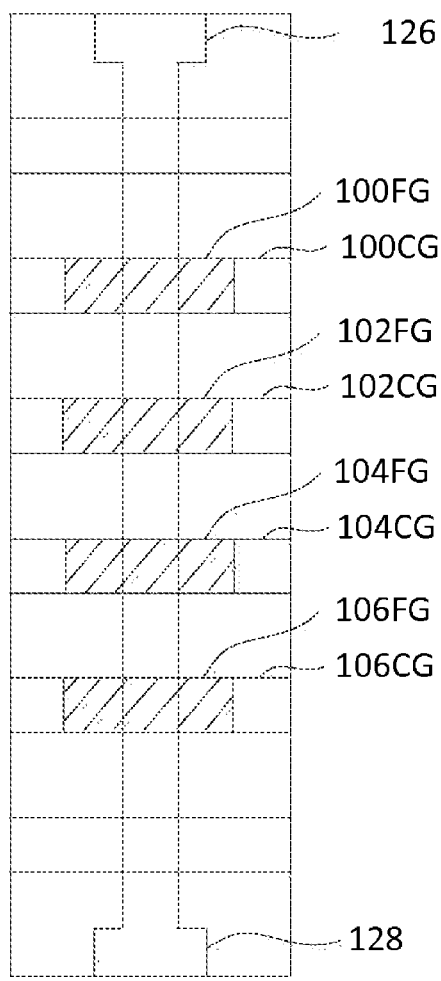
FIG. 1 is a top view of a NAND string.
Figure 2:
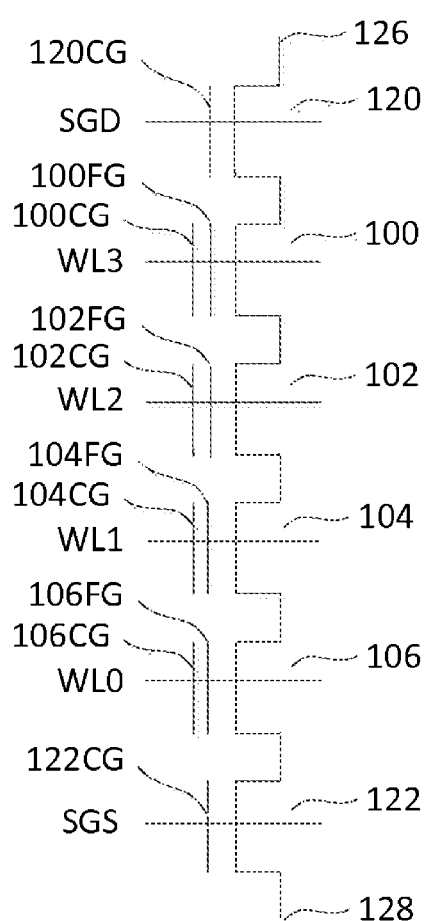
FIG. 2 is an equivalent circuit diagram of the NAND string depicted in FIG. 1.

The technology described herein can be used with various types of non-volatile storage systems. One example is a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456, 528; and U.S. Pat. Publication No. US2003/0002348. The discussion herein can also apply to other types of flash memory in addition to NAND, as well as other types of non-volatile memory.

Figure 3:
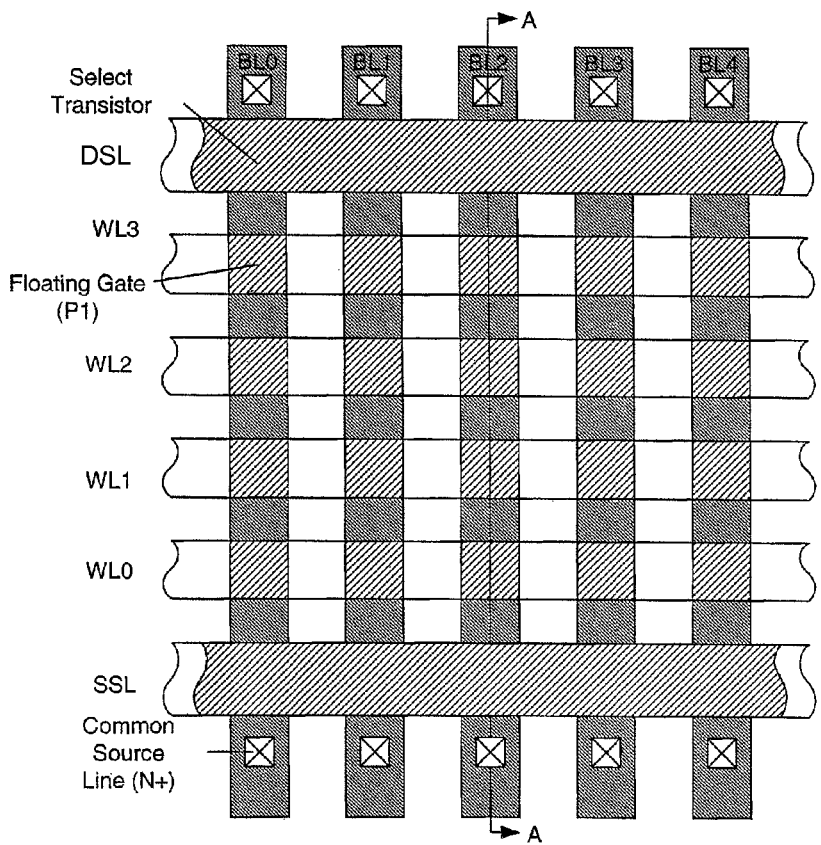
FIG. 3 is a plan view of a portion of a NAND flash memory array.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual NAND strings include 16, 32, 64, 128 or more memory cells, forming a column of memory cells. Control gate (word) lines labeled WL0-WL3 extend across multiple strings over rows of floating gates, often in polysilicon.

Figure 4:
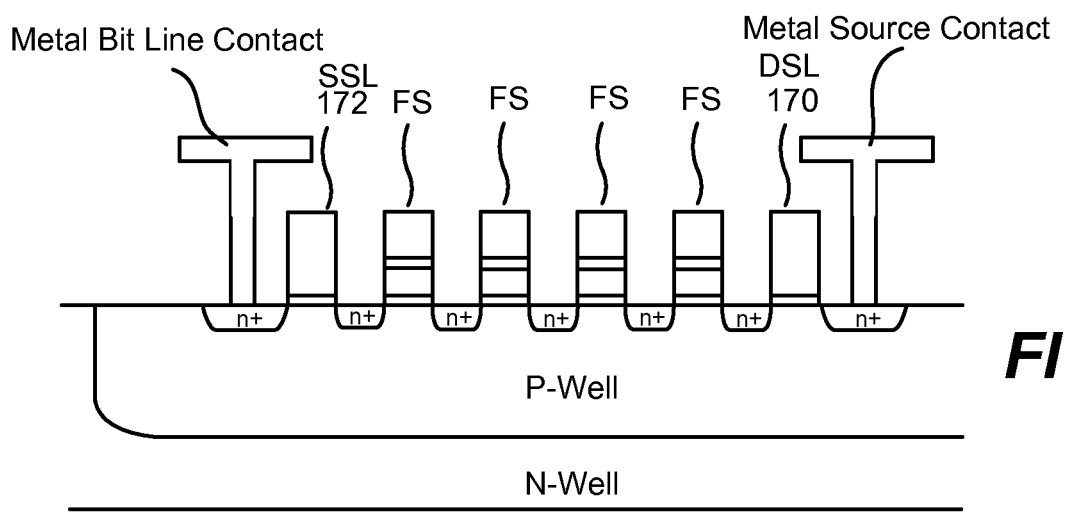
FIG. 4 is an orthogonal cross-sectional view taken along line A-A of the portion of the flash memory array depicted in FIG. 4.

FIG. 4 is a cross-sectional view taken along line A-A of FIG. 3. The control gate lines are typically formed over the floating gates as a self-aligned stack, and are capacitively coupled to the floating gates through an intermediate dielectric layer. The top and bottom of the NAND string connect to a bit line and a common source line through select transistors (gates) 170 and 172, respectively. Gate 170 is controlled by selection line DSL and gate 172 is controlled by selection line SSL. The floating gate material can be shorted to the control gate for the select transistors to be used as the active gate.

Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
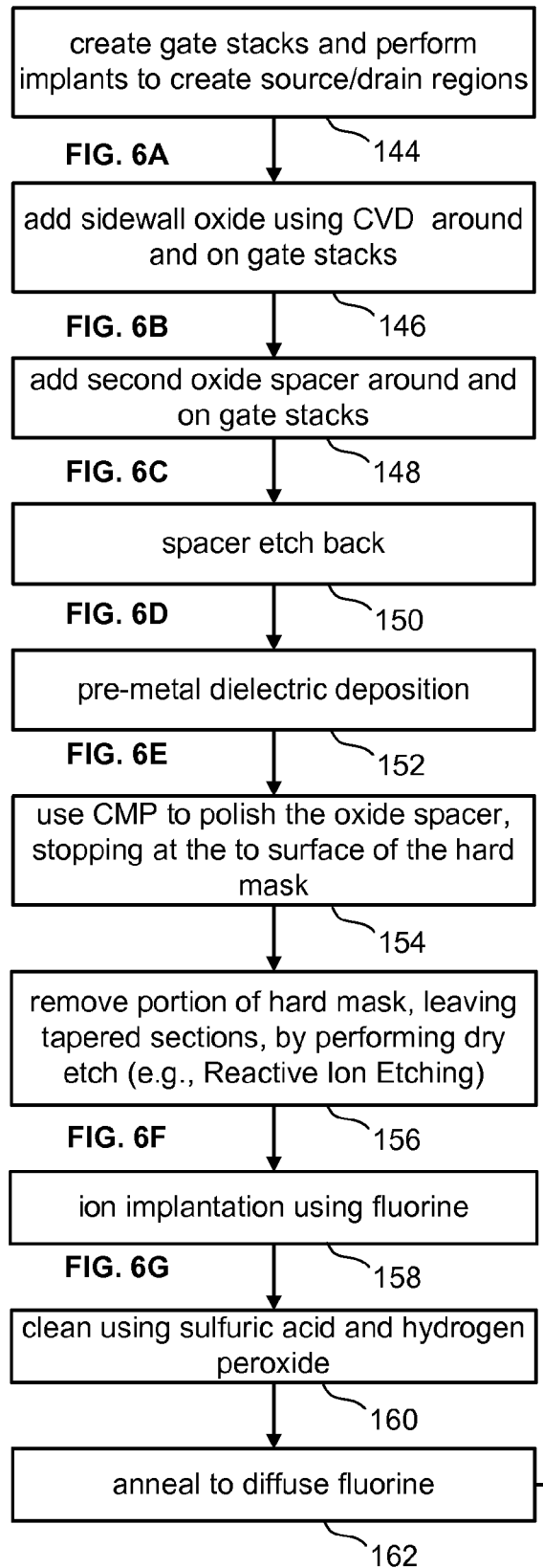
FIG. 5 is a flow chart describing one embodiment of a process for fabricating non-volatile storage.
Figure 5:
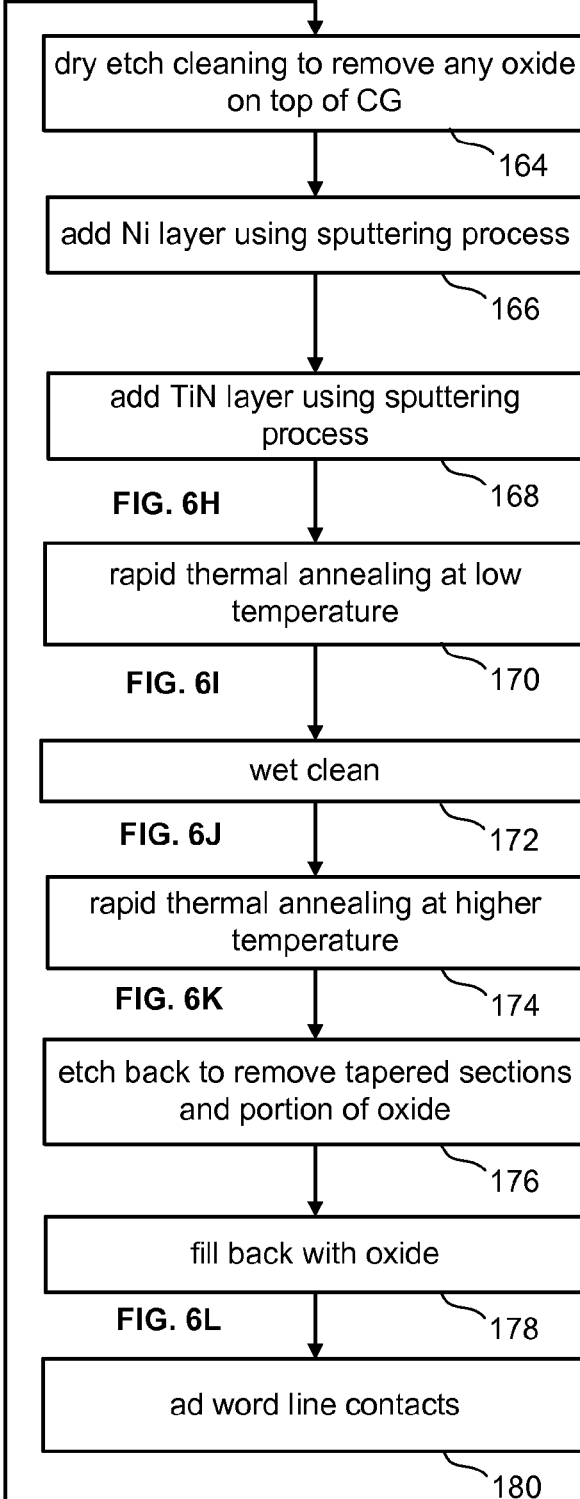

FIG. 5 is a flow chart describing one embodiment of a process for fabricating non-volatile storage. In step 144, gate stacks are created. For example, the system will use a p substrate. Within the p substrate, an n-well will be created. Within the n-well, a p-well will be created. On top of the p-well will be a set of floating gate stacks that each include a first dielectric, floating gate layer, inter-gate dielectric layer and a control gate layer. There are many processes known in the art for creating floating gate stacks. No one particular process is required for step 144. In addition to creating the floating gate stacks, an implant process is performed to create n+ source/drain regions. In one embodiment, the N+ source/drain regions are created by implanting n-type dopants such as arsenic or phosphorus into the p-well. Step 144 also includes creating a hard mask layer on top of the control gate.

Figure 6A:
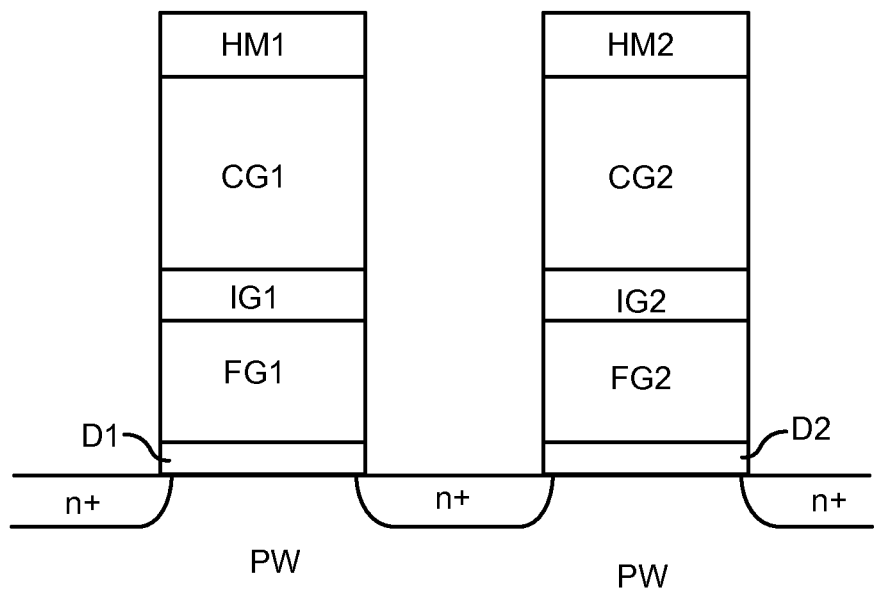
FIGS. 6A-L depict non-volatile storage during various stages of fabrication.

FIG. 6A is a cross-section depicting the non-volatile storage during the fabrication process after step 150. As can be seen, above the p-Well are two floating gate stacks. A first floating gate stack includes a dielectric layer D1, floating gate FG1, inter-gate dielectric IG1, control gate layer CG1 and hard mask layer HM1. The second floating gate includes dielectric layer D2, floating gate layer FG2, inter-gate dielectric layer IG2, control gate CG2 and hard mask MS2. Between the floating gate stacks, and implanted in the p-well are n+ source/drain regions. In one embodiment, the dielectric layers D1 and D2 are made from SiN and SiO2. In a typical embodiment, the dielectric layer comprises of Nitride/Oxide/Nitride/Oxide/Nitride (NONON) structure. In another embodiment, the aforesaid various combinations of Nitride and Oxide structure thereof. The floating gate layers FG1 and FG2 and control gate layers CG1 and CG2 of FIG. 6A are made from polysilicon. The inter-gate dielectric layers IG1 and IG2 are made from SiO2. The hard masks HM1 and HM2 are made from SiN. Other materials can also be used. Although FIG. 6A only shows two of the floating gate stacks in a memory array, the memory array will actually include many floating gate stacks.

Figure 6B:
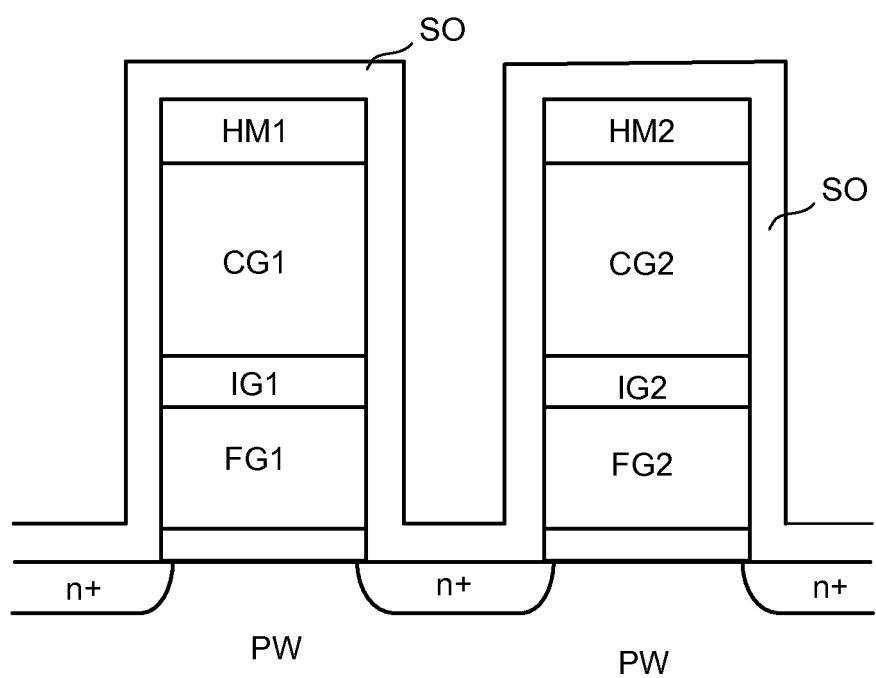
Figure 6C:
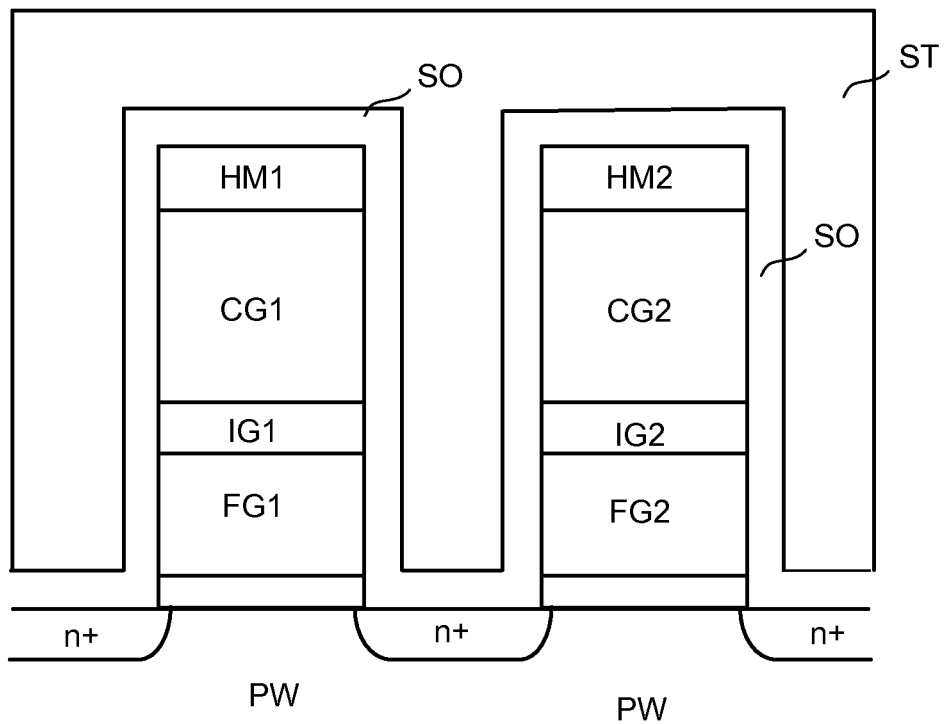
Figure 6D:
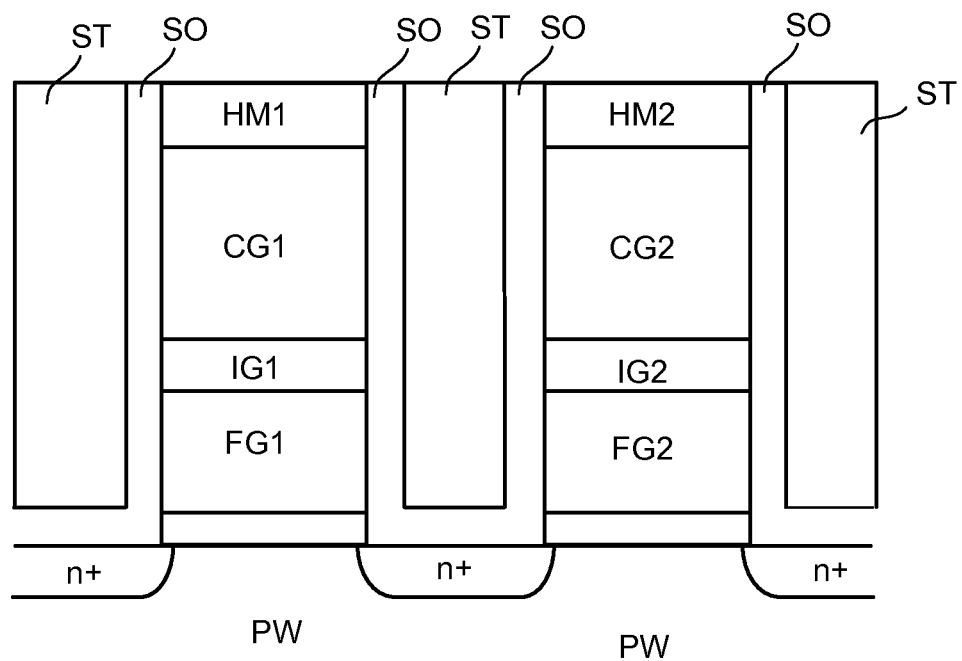
Figure 6E:
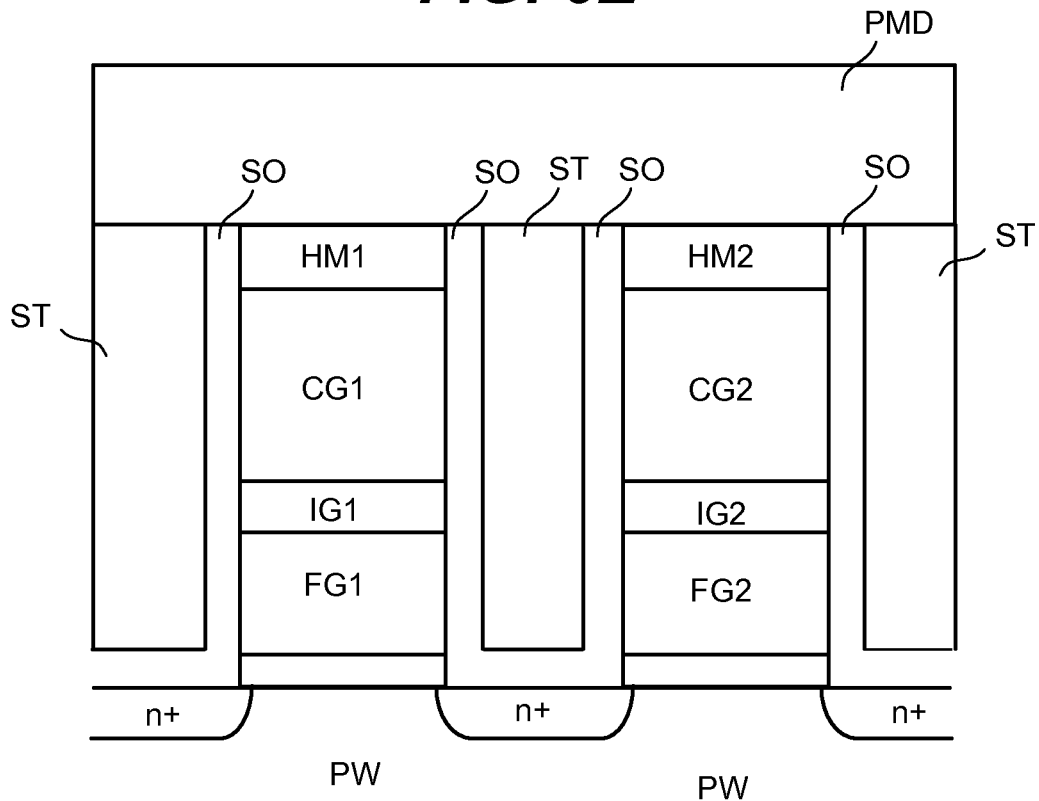

In step 146, a first sidewall oxide SiO2 spacer and implantation process is performed using CVD. FIG. 6B shows the gate stacks with the sidewall oxide SO after step 246. In step 148, a second sidewall oxide spacer is added. FIG. 6C shows the gate stacks with the second spacer material ST. In one embodiment, the oxide spacer (e.g.,. tetra-ethyl ortho-silicate) is added using chemical vapor deposition (CVD). In step 150, the oxide spacer is etched back to the top surface of the hard mask, as depicted in FIG. 6D. In step 152, a pre-metal dielectric layer (PMD) is deposited using CVD (see FIG. 6E). In step 154, Chemical Mechanical Polishing (CMP) is used to polish the pre-metal dielectric layer. The polishing stops when reaching the top surface of the hard mask (e.g. top surface of HM1 and HM2).

Figure 6F:
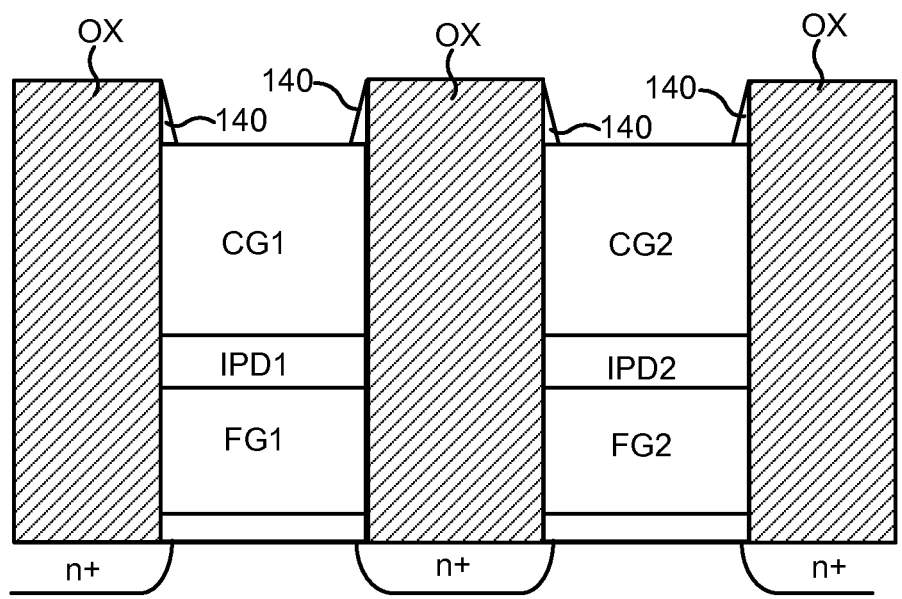

In step 156, portions of the hard mask are removed. Step 156 does not include removing all of the hard masks. Portions of the hard mask remain after step 156. The remaining portions are tapered sections. In one embodiment, the portions of the hard mask are removed by performing a dry etch. An example of a dry etch is reactive ion etching. FIG. 6F shows an example cross-section of the structure after step 156. Oxide spacer material OX, which represents the two oxide layers SO and ST, is positioned between the floating gate stacks. On top of the control gates (e.g., CG1 and CG2) are the remaining portions of the hard masks that were not etched in step 156. The remaining portions of the hard mask include two tapered sections 140 above each control gate. The two tapered sections 140 are triangular in shape and are in inverse orientations with respect to each other. For example, in one embodiment, each of the remaining sections 140 of the hard mask are right triangles having opposing upwardly sloping faces or, alternatively, the longest sides of the triangle face one another. The two tapered sections 140 above each control gate are tapered such that they increase in width from top to bottom (e.g. in the direction toward the top surface of the control gate). The two tapered sections are positioned on opposite sides of the top surface of the control gate.

Figure 6G:
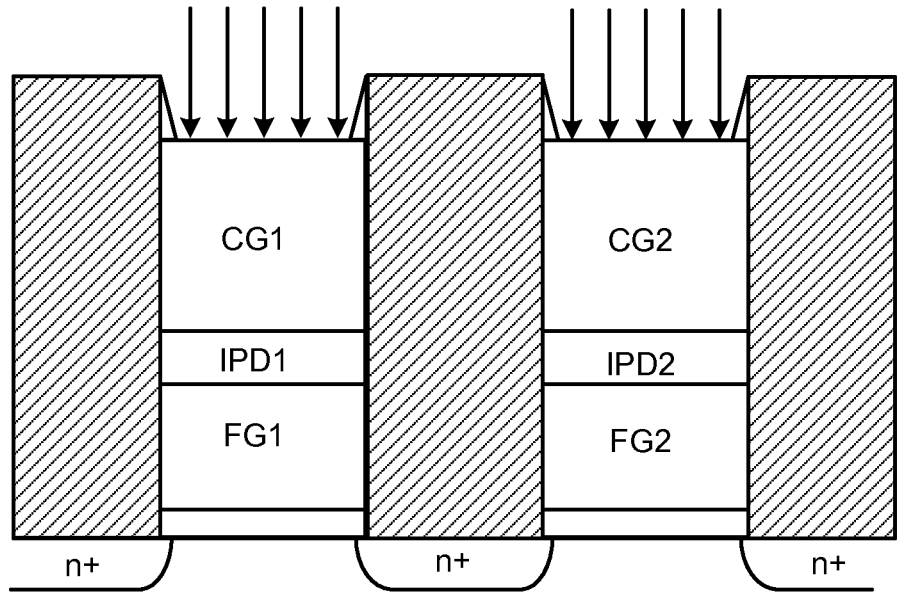

In step 158, ion implantation is performed. The process will implant fluorine into the control gates (e.g. CG1 and CG2). The purpose of the ion implantation is to passivate the traps with fluorine ions along the grain boundary of the control gate layers. FIG. 6G shows arrows indicating the ion implantation into the control gate layers (CG1 and CG2). In another embodiment of step 158, other implantations of ions (e.g., nitrogen, carbon, argon) is performed.

In step 160, the memory structure will be cleaned using wet solution (e.g., sulfuric acid and hydrogen peroxide). The post wet clean is performed to remove any contamination on the surface. In step 162, an annealing process is performed to diffuse the implanted fluorine ions. This will also help the polysilicon grain boundary at the control gate grow. The more growing the polysilicon does, the easier it will be to make NiSi later on. In step 164, a dry etch is performed to remove any oxide that is on top of the control gate. In one embodiment, step 164 is performed prior to step 158. In another embodiment, steps 158 to 162 are not performed, and the process will perform step 164 immediately after step 156.

Figure 6H:
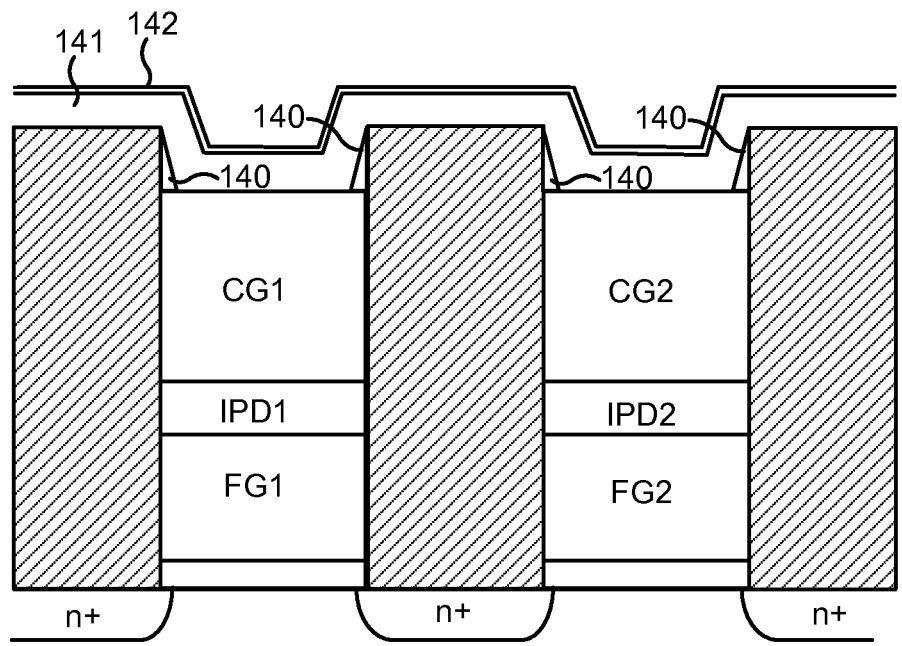

In step 166, a nickel (Ni) layer is added on top of the structure using a sputtering process. In step 168, a titanium nitride (TiN) layer is added using a sputtering process. TiN layer is to prevent nickel oxidation during subsequent thermal annealing process FIG. 6H shows the structure of the memory after performing step 168, including depicting Ni layer 141 and TiN layer 142.

Figure 6I:
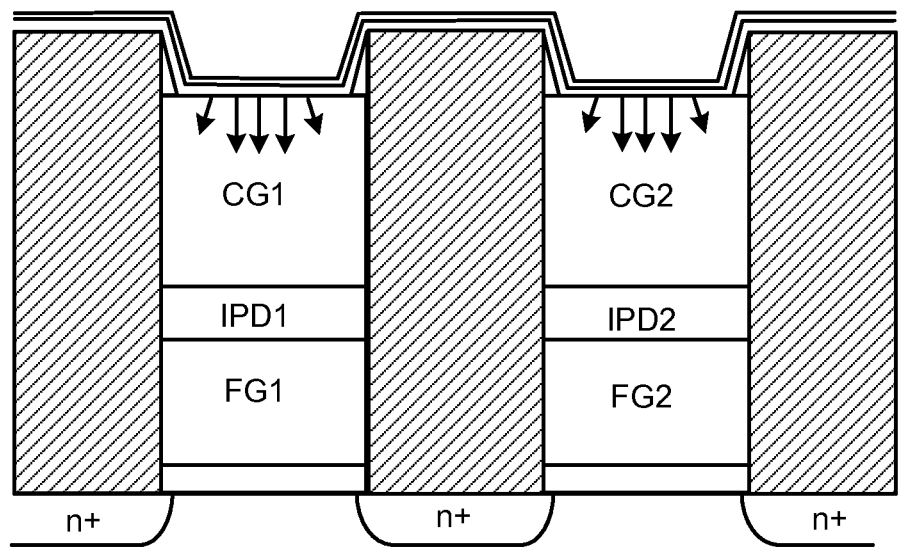

Steps 170, 172 and 174 include performing a silicidization process for the Ni layer 141 and the control gate layers. In step 170, a rapid thermal annealing is performed at a lower temperature (as compared to step 174). For example, FIG. 6I shows arrows indicating nickel infusing in and reacting with the polysilicon to form NiSi alloy at the CG layer. The Ni diffuses into the Si and gets consumed by the Si to form NiSi alloy. The tapered sections 140 help prevent the Ni from diffusing into the oxide during the annealing of step 170 and also help to confine the silicidization to prevent the Ni from going into the oxide.

Figure 6J:
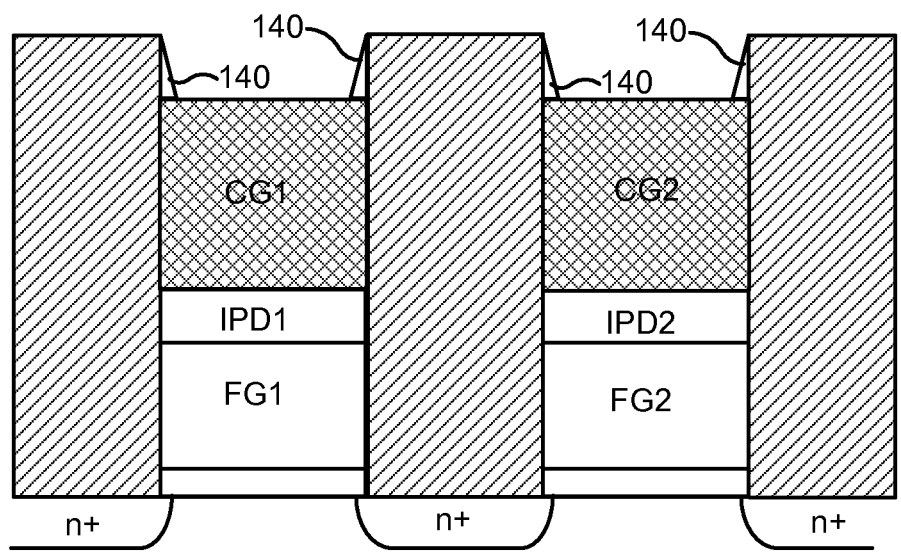

In step 172, a wet cleaning process is performed. In one embodiment, the memory structure is placed in a bath of sulfuric acid and hydrogen peroxide. This bath removes the TiN. Additionally, some of the Ni that has not reacted will also be removed. FIG. 6J shows the memory structure after step 172. As can be seen, the TiN layer 142 is removed and the unreacted Ni layer 141 is also no longer present. The control gate layers CG1 and CG2 are shown shaded to indicated that the Ni has been diffused into the control gate layer. In one embodiment, the Ni is not evenly distributed throughout the control gate layer, but rather distributed at a varying concentration such that there is a greater concentration of nickel at the top of the control gate layer and a lower concentration of nickel toward the lower portion of the control gate. In some embodiments, the nickel does not reach the bottom portion of the control gate layer.

Figure 6K:
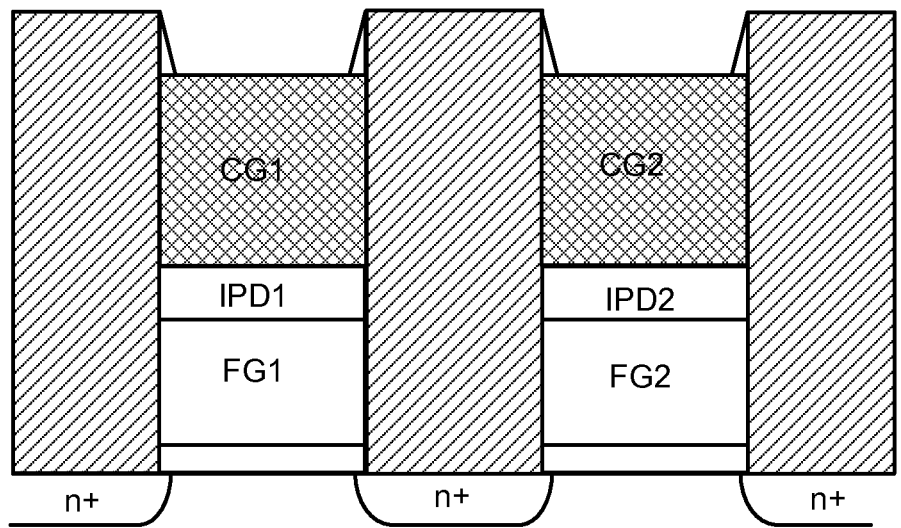

In step 174, a rapid thermal annealing is performed. The rapid thermal annealing in step 174 is performed at a higher temperature than the rapid thermal annealing of step 170. In this step, the desired monosilicide NiSi phase is formed. FIG. 6K shows the structure of the memory after performing the second rapid thermal annealing of step 174. Again, the control gates CG1 and CG2 are shown shaded to indicate that the nickel has infused into the control gate's polysilicon. In some embodiments, the diffusion is not done evenly throughout the control gate and it is likely that there is a great concentration of nickel on the top of the control gate and (possibly) very little, if any, nickel at the bottom of the control gate.

Figure 6L:
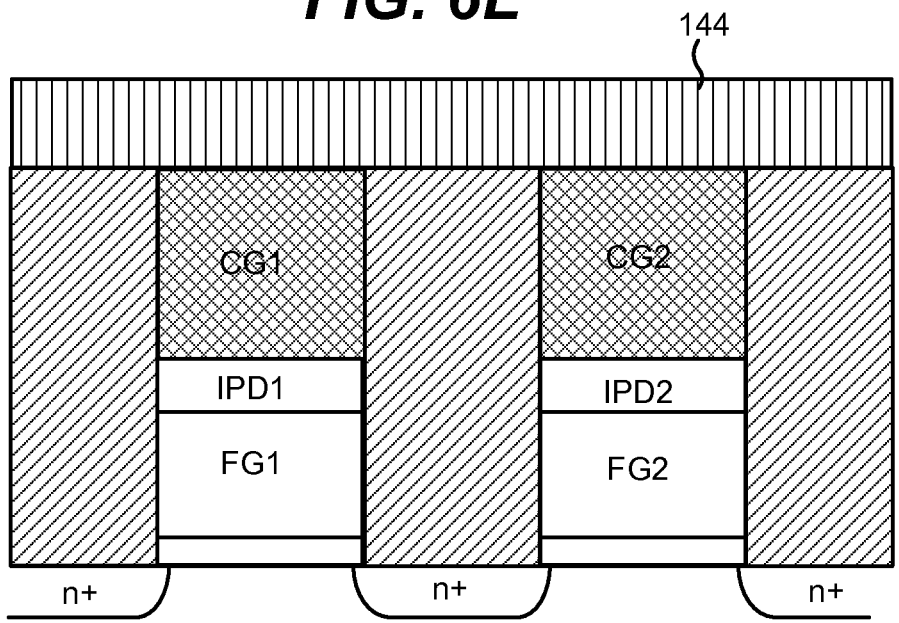

In step 176, the structure will be subjected to etching in order to remove tapered sections 140. In one embodiment, a wet chemistry can be used that includes hot phosphoric acid ($H_3PO_4$). A wet chemistry can be used that includes buffered or diluted hydrofluoric acid (BHF or DHF) for oxide removal. The etching will etch down to the top of the control gate (CG1 and CG2). In step 178, oxide will be used to fill back the top of the structure. In another embodiment, the portion of oxide in step 176 remained and step 178 is performed. For example, FIG. 6L shows oxide 144 on top of the control gate CG1 and CG2. In step 180, word line contacts will be added to connect to the word lines, using processes known in the art. The above-described process will cause metal to be infused into the control gates such that there will be a metal layer connecting each memory cell along a common word line. Step 180 adds word line contact similar at selected location on the metal layer. After step 180, processes known in the art can be used to add various metal layers for routing and bit lines, as well as to add peripheral transistors and other components for various support circuitry.

In one embodiment, the floating gate stacks will be created in step 150 without the hard masks. Alternatively, after the floating gate stacks are created, the hard masks will be removed in their entirety. In this embodiment, steps 152-156 will be skipped. That is, the process will perform step 158 after step 150. In one embodiment, the oxide spacer OX is under the control gate poly. In another embodiment, the oxide spacer OX and control gate poly are at same height or level. The process will then continue as discussed above. In the manner, the system will not create the tapered sections; however, the system will still perform ion implantation using fluorine.

The fluorine implantation prior to the silicidization helps to control the Ni diffusion into the polysilicon as well to obtain a flat surface morphology due to large grain boundary size, passivate traps/grain boundary passivation, improve roughness of the surface, and retard the formation of $NiSi_2$. Also, whisker formation of the metal layer will be reduced, resistance will be lowered and there will higher thermo stability. The enhancement of NiSi thermal stability is due to the implanted Fluorine ions segregates to the silicide interface and poly silicon grain boundary.

Figure 7:
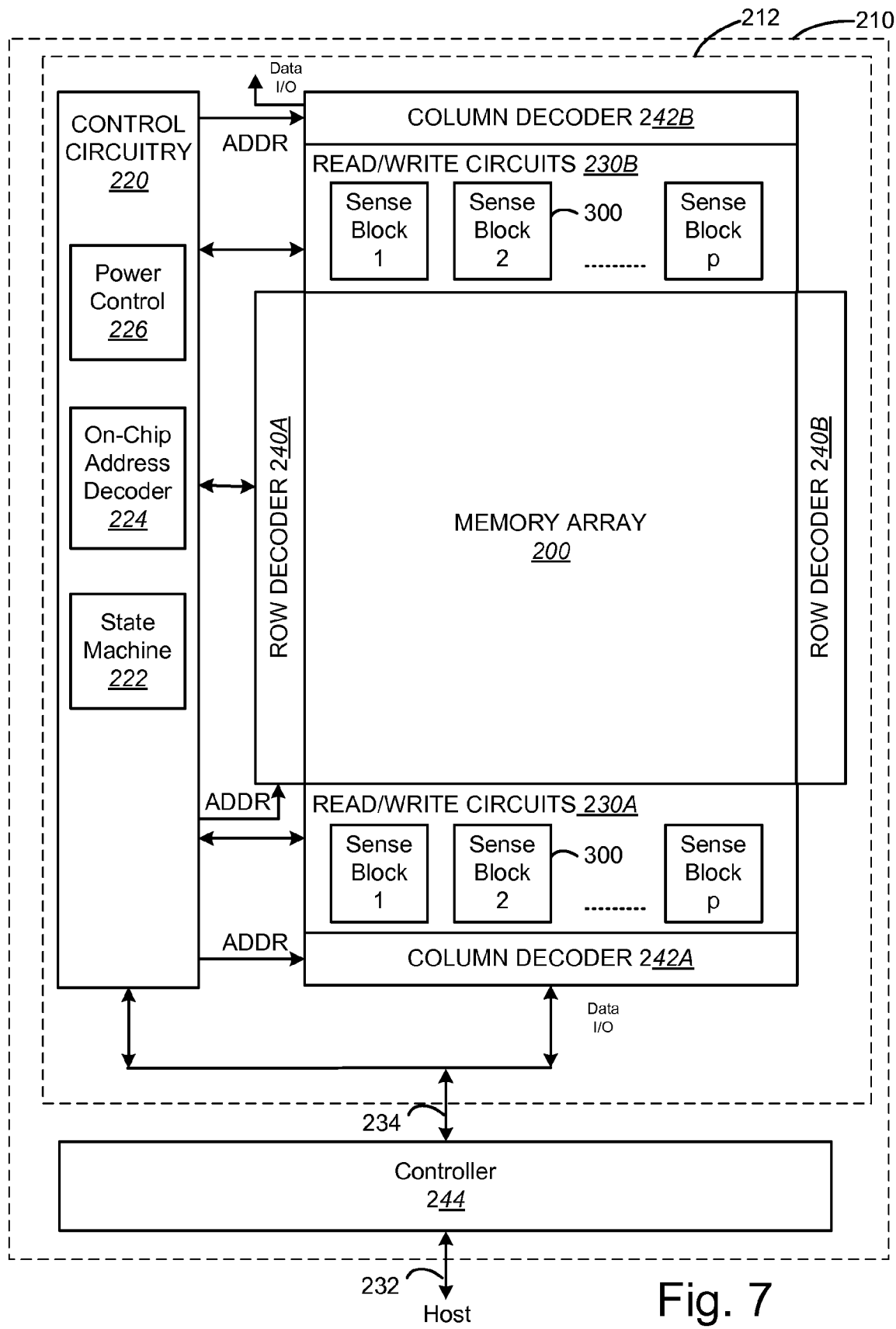
FIG. 7 is a block diagram of a non-volatile memory system.

FIG. 7 illustrates a memory device 210 having read/write circuits for reading and programming a page (or other unit) of memory cells (e.g., NAND multi-state flash memory or other type) in parallel. Memory device 210 may include one or more memory die or chips 212. Memory die 212 includes an array (two-dimensional or three dimensional) of memory cells 200 (fabricated as discussed above), control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212; however, the controller can also be separate. Commands and data are transferred between the host and controller 244 via lines 232 and between the controller and the one or more memory die 212 via lines 234.

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes to read, write and program.

FIG. 8 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of eras can also be used. The memory cells of array 200 are fabricated as discussed above.

A block contains a set of NAND stings which are accessed via bit lines (e.g., bit lines BL0-BL69623) and word lines (WL0, WL1, WL2, WL3). FIG. 8 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Since the lateral and vertical diffusion is controlled in the above-described fabrication process, potential electrical shorts between word lines can be avoided. After thermal cycles, low resistivity of the word line will be achieved due to flat interface, improved roughness, grain boundary passivation and hindrance to unintended high resistive phase formation of the gate contact layer.

One embodiment includes creating gate stacks with hard masks on top of the gate stacks, removing a portion of the hard masks (leaving two separate tapered sections of each of the hard masks), adding metal, performing a silicidation process for the metal and the floating gate stacks, remove the tapered sections, and adding control lines.

One embodiment includes creating gate stacks, applying fluorine to a top surface of the control gate, providing a metal, performing a silicidation process for the metal and the floating gate stacks, and adding control lines. The applying fluorine is performed prior to the silicidation process.

One embodiment includes creating gate stacks with hard masks on top of the gate stack. The gate stacks include two polysilicon layers and a dielectric layer between the two polysilicon layers. The two polysilicon layers include a lower polysilicon layer and an upper polysilicon layer. The method further includes removing a portion of the hard masks (leaving two separate tapered sections of each of the hard masks positioned above the upper polysilicon layer of the gate stacks), implanting fluorine into the upper polysilicon layer of the gate stacks after the removing the portion of the hard masks, adding metal on a top surface of the upper polysilicon layer of the gate stacks after implanting the fluorine, performing a silicidation process for the metal and the upper polysilicon layer of the gate stacks, removing the tapered sections, and adding control lines.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method for fabricating non-volatile storage, comprising:
    creating gate stacks with hard masks on top of the gate stacks;
    removing a portion of the hard masks, leaving two separate tapered sections of each of the hard masks;
    adding metal;
    performing a silicidation process for the metal and the gate stacks;
    removing the tapered sections; and
    adding control lines connected to the gate stacks.

2. The method of claim 1, further comprising:
    after the removing the portion of the hard masks, applying fluorine to a top surface of the gate stacks.

3. The method of claim 1, further comprising:
    after the removing the portion of the hard masks, applying fluorine to a top surface of the gate stacks using ion implantation.

4. The method of claim 1, wherein:
    the two tapered sections of each of the hard marks are triangular in shape.

5. The method of claim 1, wherein:
    the gate stacks include two polysilicon layers and a dielectric layer between the two polysilicon layers, the two polysilicon layers include a lower polysilicon layer and an upper polysilicon layer; and
    the two tapered sections of each of the hard marks are positioned on opposite sides of a top surface of the upper polysilicon layer.

6. The method of claim 5, wherein:
    the two tapered sections of each of the hard marks are triangular in shape and are in an inverse orientations with respect to each other; and
    the two tapered sections of each of the hard marks are tapered such that the increase in width in the direction toward the top surface of the upper polysilicon layer.

7. The method of claim 1, wherein the removing the portion of the hard masks comprises:
    performing a dry etch of the hard marks.

8. The method of claim 1, wherein the removing the portion of the hard masks comprises:
    performing reactive ion etching of the hard masks.

9. The method of claim 1, further comprising:
    adding oxide around and on the gate stacks prior to the removing; and
    polishing the oxide down to a surface of the hard masks prior to the removing.

10. The method of claim 1, further wherein the silicidation process comprises:
    performing a first rapid thermal annealing, at a first temperature, to the gate stacks;
    performing a wet cleaning process to the gate stacks; and
    performing a second rapid thermal annealing, at a second temperature that is higher than the first temperature, to the gate stacks.

11. A method for fabricating non-volatile storage, comprising:
    creating gate stacks with hard masks on top of the gate stacks, the gate stacks include two polysilicon layers and a dielectric layer between the two polysilicon layers, the two polysilicon layers include a lower polysilicon layer and an upper polysilicon layer;
    removing a portion of the hard masks, leaving two separate tapered sections of each of the hard masks positioned above the upper polysilicon layer of the gate stacks;
    after the removing the portion of the hard masks, implanting fluorine into the upper polysilicon layer of the gate stacks;
    adding metal on a top surface of the upper polysilicon layer of the gate stacks after implanting the fluorine;
    performing a silicidation process for the metal and the upper polysilicon layer of the gate stacks;
    removing the tapered sections; and
    adding control lines connected to the gate stacks.

12. The method of claim 11, wherein:
    the two tapered sections of each of the hard marks are positioned on opposite sides of a top surface of the upper polysilicon layer;
    the two tapered sections of each of the hard marks are triangular in shape and are in an inverse orientations with respect to each other; and
    the two tapered sections of each of the hard marks are tapered such that the increase in width in the direction toward the top surface of the upper polysilicon layer.

13. The method of claim 12, wherein the removing the portion of the hard masks comprises:
    performing reactive ion etching of the hard masks.

14. The method of claim 13, further comprising:
    annealing to diffuse out fluorine after implanting the fluorine.

15. The method of claim 14, further comprising:
    adding oxide around and on the floating gate stacks prior to the removing; and
    polishing the oxide down to a surface of the hard masks prior to the removing.

16. The method of claim 15, further wherein the silicidation process comprises:
    performing a first rapid thermal annealing, at a first temperature, to the gate stacks;
    performing a wet cleaning process to the gate stacks; and
    performing a second rapid thermal annealing, at a second temperature that is higher than the first temperature, to the gate stacks.

* * * * *